United States Patent
Jung et al.

(12) 
(10) Patent No.: US 6,480,020 B1
(45) Date of Patent: Nov. 12, 2002

(54) PRINTED CIRCUIT ASSEMBLY HAVING INTEGRATED RESISTORS FOR TERMINATING DATA AND CONTROL LINES OF A HOST-PERIPHERAL INTERFACE

(75) Inventors: Hoover K. Jung, Rosemead, CA (US); Sanjay S. Mathur, Languna Hills, CA (US); Virgil V. Wilkins, Perris, CA (US)

(73) Assignee: Western Digital Technologies, Inc., Lake Forest, CA (US)

( * ) Notice: Subject to any disclaimer, the term of this patent is extended or adjusted under 35 U.S.C. 154(b) by 0 days.

(21) Appl. No.: 09/314,277

(22) Filed: May 18, 1999

(51) Int. Cl.$^7$ .......................................... H03K 19/0175
(52) U.S. Cl. .......................................... 326/30; 326/82
(58) Field of Search ............................... 326/26–28, 30, 326/82, 83, 86

(56) References Cited

U.S. PATENT DOCUMENTS

| 3,832,575 A | | 8/1974 | Dasgupta et al. | |
|---|---|---|---|---|
| 5,742,183 A | * | 4/1998 | Kuroda | 326/81 |
| 6,018,272 A | * | 1/2000 | Marsh et al. | 257/538 |
| 6,198,307 B1 | * | 3/2001 | Garlepp et al. | 326/30 |
| 6,211,703 B1 | * | 4/2001 | Takekuma et al. | 326/30 |

* cited by examiner

Primary Examiner—Michael Tokar
Assistant Examiner—Don Phu Le
(74) Attorney, Agent, or Firm—Milad G. Shara, Esq.

(57) ABSTRACT

A printed circuit board assembly (PCBA) includes first and second integrated-circuit terminals and first and second connector terminals. A first transmission line transmits a data signal and a second transmission line transmits a clocking signal. The PCBA includes integrated circuitry comprising first and second pads, a first digital circuit for propagating the data signal through the first pad and a second digital circuit for propagating the clocking signal through the second pad. The first transmission line includes a first integrated-circuit conductive path including a first series-connected integrated circuit resistive element and a first printed-circuit conductive path. The second transmission line includes a second integrated-circuit conductive path including a second integrated-circuit resistive element and a second printed-circuit conductive path. The first resistive element has a first ohmic value, the second resistive element has a second ohmic value, the first printed circuit conductive path has a third ohmic value and the second printed circuit conductive path has a fourth ohmic value. The ratio of the third to the first ohmic value is such that the first ohmic value is in excess of an order of magnitude greater than the third ohmic value and the ratio of the fourth to the second ohmic value is such that the second ohmic value is in excess of an order of magnitude greater than the fourth ohmic value. The ratio of the first to the second ohmic value is substantially less than the ratio of the third ohmic value to the first ohmic value.

24 Claims, 3 Drawing Sheets

PRINTED CIRCUIT ASSEMBLY HAVING INTEGRATED RESISTORS FOR TERMINATING DATA AND CONTROL LINES OF A HOST-PERIPHERAL INTERFACE

BACKGROUND OF THE INVENTION

1. Field of the Invention

The present invention relates to interfaces between a host computer and a peripheral device, such as a magnetic hard disk drive. More particularly, the present invention relates to a printed circuit assembly and to an integrated circuit including integrated resistors for terminating data and control lines of a host peripheral interface.

2. Description of the Prior Art and Related Information

Disk drives typically communicate with host computers via standardized interfaces. One such standardized interface is the Integrated Drive Electronics (IDE) interface, sometimes referred to as the AT attachment (ATA) interface. The IDE interface was originally based upon the IBM PC AT 16-bit bus standard, although most disk drives today utilize an enhanced version of the standard, which may be called EIDE or ATA-n where n represents a generation of the standard that has been documented in a standards committee. In the IDE or EIDE or ATA interfaces (hereafter collectively IDE), the disk drive controller is built into the logic board of the disk drive and communicates with the host computer system via a 40 conductor (typically flat) cable. Originally, programmed input/output (I/O) was used as the protocol for transferring data between the disk drive and the host computer system, forsaking the then slower Direct Memory Access (DMA) capabilities of the AT bus. The specification for the 40-conductor (unterminated) IDE interface called for seven ground wires and data signal transfer rate of about 6 to 8 MHz, the speed of the AT bus. While adequate for such low data transfer speeds, the programmed I/O method of data transfer, the low data transfer rate and the physical configuration of the IDE 40-conductor cable proved to be inadequate in the face of increasing drive performance and higher data transfer speed requirements.

The ATA interface, therefore, evolved over the years to allow high-speed DMA-based transfers. A new series of protocols, known variously as "Ultra-ATA", "Ultra DMA" or "UDMA" have been developed to match increasing drive performance and higher data transfer rate requirements. Several UDMA "modes" have been defined, each UDMA mode being a function of the nominal data transfer rate. For example, UDMA mode 0 specifies a nominal data transfer rate of 16.67 megabytes per second (hereafter MB/s). Mode 1 specifies a transfer rate of 22.22 MB/s, Mode 2 a transfer rate of 33.33 MB/s, Mode 3 a rate of 44.44 MB/s and mode 4, a nominal data transfer rate of 66.66 MB/s. Such high transfer rates were made possible by a number of modifications to the ATA bus, including the implementation of double-edged clocking, source-synchronous signaling and a series resistor termination at the interface to match the characteristic impedance of the cable. The series-terminating resistor reduces ringing and reflection of the signal propagated down the cable and allows a faster data settling time, a crucial and transfer speed-determinative measure.

For transfer speeds up to about 33.33 MB/s (UDMA modes 0–2), the original 40-conductor cable is adequate. However, as the 40-conductor cable only includes 7 ground wires (only two of which are adjacent to the data lines), crosstalk is a major factor in scaling up to data transfer rates above those specified in modes 0–2. For UDMA modes 3 and 4, therefore, a new 80-conductor cable has been developed that includes ground return paths alternating between each of the original 40 conductors. Each of the 40 ground wires of the 80-conductor cable is connected to the 7 ground wires of the original 40-conductor UDMA cable. The addition of the 40 ground wires decreases crosstalk and the inductance on the ATA bus. In scaling up to data transfer rates of 33.33 and 66.6 MB/s and beyond, the series termination takes on a critical importance, because the electrical characteristics of the source-terminated line ultimately determine what data rates are achievable. In the UDMA environment, the effective driving impedance of a source, as seen from the connector, should be between about 40 ohms (Ω) and about 50 Ω, for a series terminating resistor having the recommended value of about 33 Ω.

Typically, surface mounted resistors are used to terminate the ATA interface. Although surface mounted resistors are relatively inexpensive, their use in the ATA interface entails non-negligible assembly costs to mount the resistors on the printed circuit board of the interface. Moreover, surface mounted components, such as resistors, occasionally suffer from solder shorts, misconnections, and other physical defects. Therefore, costs must be allocated, during the interface manufacturing process, to identify and correct such defects.

Heated competition in the consumer and enterprise-level computer peripheral market has led disk drive manufacturers to trim costs wherever possible. The UDMA host interface has been identified as a potential candidate for the implementation of further cost-saving measures. Indeed, it is desirable to find cost-effective alternatives to surface-mounted series terminating resistors. Such alternatives should reduce the overall costs of the interface, including the material costs of the surface-mounted resistors themselves, as well as the accompanying costs of mounting the resistors on the board and the costs associated with identifying and correcting such physical defects at solder shorts and misconnections, while providing an effective termination of the interface, consistent with data transfer speeds having a magnitude at least as great as those specified in UDMA modes 3 and 4.

SUMMARY OF THE INVENTION

An object of this invention, therefore, is to provide cost-effective printed and integrated circuitry for host peripheral interfaces supporting the UDMA data transfer protocols and other high data transfer speed protocols. More particularly, an object of this invention is to provide a lower-cost alternative to surface mounted termination transistors for terminating data and control lines of a host-peripheral interface.

Accordingly, this invention can be regarded as a printed circuit board assembly (PCBA) that is plug compatible with a host-peripheral interface via which digital data are synchronously transmitted at a data rate via conductive paths that exhibit transmission-line characteristics at the data rate. The printed circuit board assembly comprises a first and a second integrated-circuit terminal and a first and a second connector terminal. The PCBA also includes a first transmission line for transmission of a data signal and a second transmission line for transmission of a clocking signal. Integrated circuitry on the PCBA includes a first and second pad, a first digital circuit for propagating the data signal through the first pad and a second digital circuit for propagating the clocking signal through the second pad. The first transmission line includes a first integrated-circuit conductive path including a first integrated-circuit resistive element connected in series between the first pad and the first digital circuit and a first printed-circuit conductive path. The second transmission line includes a second integrated-circuit conductive path including a second integrated-circuit resistive element and a second printed-circuit conductive path. The first integrated-circuit element has a first ohmic value and the second integrated-circuit element has a second ohmic value. The first printed circuit conductive path has a third ohmic value, and the second printed circuit conductive path has a fourth ohmic value. The ratio of the third ohmic value to the first ohmic value is such that the first ohmic value is in excess of an order of magnitude greater than the third ohmic value. The ratio of the fourth ohmic value to the second ohmic value is such that the second ohmic value is in excess of an order of magnitude greater than the fourth ohmic value. The ratio of the first ohmic value to the second ohmic value is substantially less than the ratio of the third ohmic value to the first ohmic value.

According to other embodiments, the first integrated resistive element may include one or more first n-type portions and one or more first p-type portions. The first n-type portion(s) may include material doped with an n-type dopant, and the first p-type portion(s) may include material doped with a p-type dopant, the first n-type portion(s) and the first p-type portion(s) being electrically coupled to one another via a first metal layer. The first n-type portion(s) may include a first n-type layer including material doped with the n-type dopant and a second n-type layer including material doped with the n-type dopant, the second n-type layer being electrically coupled to the first n-type layer by the first metal layer. The second integrated resistive element may include one or more second n-type portions and one or more second p-type portions, the second n-type portion(s) including material doped with an n-type dopant and the second p-type portion(s) including material doped with a p-type dopant, the second n-type portion(s) and the second p-type portion(s) being electrically coupled to one another via a second metal layer. The second n-type portion(s) may include a third n-type layer including material doped with the n-type dopant and a fourth n-type layer including material doped with the n-type dopant, the fourth n-type layer being electrically coupled to the third n-type layer by the second metal layer. Each of the first and second ohmic values may be selected in the range between about 30 Ω and about 90 Ω. The integrated circuitry may implement an ATA Ultra DMA protocol and each of the first and second integrated circuit resistive elements may include one or more portions doped with an n-type dopant and one or more other portions doped with a p-type dopant.

The present invention may also be viewed as an integrated circuit for a host-peripheral interface via which digital data are synchronously transmitted at a data rate via conductive paths that exhibit transmission-line characteristics at the data rate. The integrated circuit comprises a first integrated-circuit terminal and a first connector terminal, a first transmission line for transmission of a data signal, a second integrated-circuit terminal and a second connector terminal and a second transmission line for transmission of a clocking signal. A first digital circuit propagates the data signal through a first pad and a second digital circuit propagates the clocking signal through a second pad. The first transmission line includes a first integrated-circuit conductive path including a first integrated-circuit resistive element connected in series between the first pad and the first digital circuit, and the second transmission line includes a second integrated-circuit conductive path including a second integrated-circuit resistive element. The first integrated-circuit element has a first ohmic value and the second integrated-circuit element has a second ohmic value, each of the first and second ohmic values being of a magnitude that substantially matches a characteristic impedance of the conductive paths at the data rate.

According to further embodiments, the magnitude of each of the first and second integrated circuit resistive elements may be selected between about half and about double the characteristic impedance of the conductive paths at the data rate. The first integrated resistive element may include one or more first n-type portions and one or more first p-type portions, the first n-type portion(s) including material doped with an n-type dopant and the first p-type portion(s) including material doped with a p-type dopant, the first n-type portion(s) and the first p-type portion(s) being electrically coupled to one another via a first metal layer. The first n-type portion(s) may include a first n-type layer including material doped with the n-type dopant and a second n-type layer including material doped with the n-type dopant, the second n-type layer being electrically coupled to the first n-type layer by the first metal layer. The second integrated resistive element may include one or more second n-type portions and one or more second p-type portions, the second n-type portion(s) including material doped with an n-type dopant and the second p-type portion(s) including material doped with a p-type dopant, the second n-type portion(s) and the second p-type portion(s) being electrically coupled to one another via a second metal layer. The second n-type portion(s) may include a third n-type layer including material doped with the n-type dopant and a fourth n-type layer including material doped with the n-type dopant, the fourth n-type layer being electrically coupled to the third n-type layer by the second metal layer. Each of the first and second ohmic values may be selected in the range between about 30 Ω and about 90 Ω. The integrated circuit may implement an ATA Ultra DMA protocol and each of the first and second integrated circuit resistive elements may include one or more portions doped with an n-type dopant and one or more other portions doped with a p-type dopant.

The present invention may also be viewed as a printed circuit board assembly comprising an integrated-circuit terminal and a connector terminal, a printed-circuit conductive path connecting the integrated circuit terminal and the connector terminal, and integrated circuitry. The integrated circuitry includes a pad, a digital circuit for propagating the signal through the pad and an integrated-circuit conductive path connecting the pad to the integrated circuit terminal. The integrated circuit conductive path includes an integrated-circuit resistive element connected in series between the pad and the digital circuit, the integrated-circuit resistive element including one or more first portions doped with an n-type dopant electrically coupled to and separated from one or more second portions doped with a p-type dopant.

The first portion(s) doped with the n-type dopant may include a first n-type layer including material doped with the n-type dopant and a second n-type layer including material doped with the n-type dopant, the second n-type layer being electrically coupled with first n-type layer via a metal layer.

In another aspect the invention may be regarded as a source-synchronous driver circuit embedded in an integrated circuit chip. The source synchronous circuit comprises a first driver for transmitting a data signal; a first resistive element being connected in series between the first driver and a first pad; a second driver for transmitting a strobe signal simultaneously with the data signal to indicate validity of the data signal; and a second resistive element being connected in series between the second driver and a second pad The second pad is connected to a second pin for connecting the strobe signal to a second printed circuit board trace.

The foregoing and other features of the invention are described in detail below and set forth in the appended claims.

DETAILED DESCRIPTION

Figure 1:
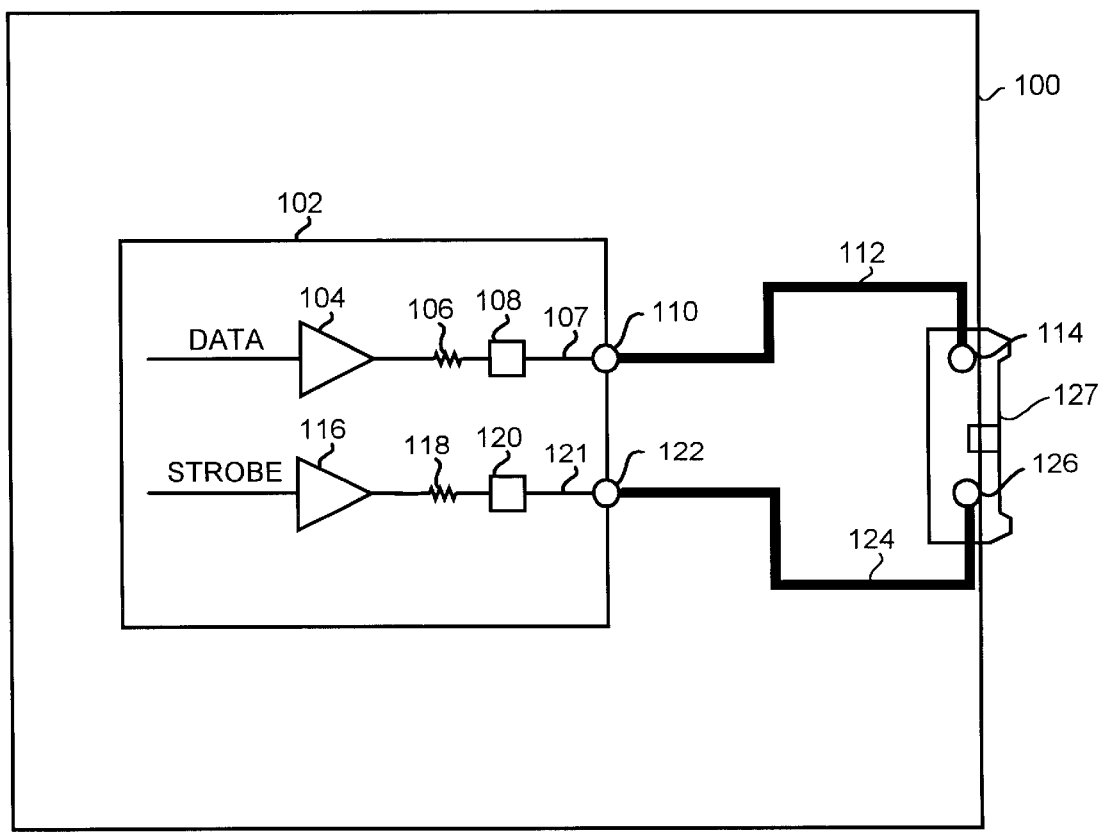
FIG. 1 is a schematic of a printed circuit board assembly according to an embodiment of the present invention.

FIG. 1 shows a block diagram of a printed circuit board assembly 100 according to an embodiment of the present invention. The printed circuit board assembly 100 of FIG. 1 includes an integrated circuit 102 having first and second integrated circuit terminals 110 and 122 which may be part of a lead frame structure. The integrated circuit 102 may include, for example, a peripheral device controller, such as a hard disk drive controller and/or a host-peripheral interface to interface one or more such devices to a host computer system, among other functional components. For example, the integrated circuit 102 mounted to the printed circuit board assembly 100 may include a disk drive controller and a host peripheral interface having the capability to support UDMA data transfers at modes 3 and/or 4. The first integrated circuit terminal 110, as shown in FIG. 1, is connected to a first connector terminal 114 via a first printed circuit conductive path 112 formed of, for example, copper. Similarly, the second integrated circuit terminal 122 is connected to the second connector terminal 126 via a second printed circuit conductive path 124. The first and second connector terminals 114, 126 are terminals of a connector 127 that is plug-compatible with a host peripheral interface via which digital data are synchronously transmitted. For example, the connector 127 may be plug-compatible (have a pin-out) that is compatible with an 80 pin ATA-n interface cable providing for the aforementioned UDMA modes of higher speed data transfer. At the data rate at which the digital data are synchronously transmitted between the host system and the device via the host-peripheral interface, the conductive paths, such as the conductive paths of the 80-conductor cable specified in the UDMA modes 3 and 4 protocols, exhibit transmission line characteristics. At such data rates, the 80-conductor cable that mates to the connector 127 exhibits transmission line characteristics that may be modeled as an equivalent resistor, inductor, capacitor (RLC) circuit, as is known in the data transmission arts. Such an equivalent RLC circuit may be said to exhibit a particular characteristic impedance at the target data rate.

The integrated circuit 102 of the printed circuit board assembly 100 includes a first transmission line for transmission of a data signal. This first transmission line is labeled "DATA" in FIG. 1 and extends at least from the input of the first digital circuit 104 to the first connector terminal 114. For ease of illustration, FIG. 1 shows only a single first transmission line for transmission of a data signal. However, the printed circuit board assembly 100 and the integrated circuitry 102 shown in FIG. 1 may collectively include a plurality of such first transmission lines for transmission of a corresponding plurality of data signals. The printed circuit board assembly 100 also includes a second transmission line for transmission of a clocking signal. The second transmission line is labeled "STROBE" in FIG. 1 and extends at least from the input of the second digital circuit 116 to the second connector terminal 126. Also for ease of illustration, FIG. 1 shows only a single second transmission line for transmission of a clocking signal. However, the printed circuit board assembly 100 and the integrated circuitry 102 shown in FIG. 1 may include a plurality of such second transmission lines for transmission of a corresponding plurality of clocking signals. Alternatively, a single second transmission line for transmission of a single clocking signal may be present in the printed circuit assembly 100 and the integrated circuitry 102 according to the present invention.

The configuration shown in FIG. 1, i.e. a data signal with accompanying strobe originating at the source of the data signal, is termed a source-synchronous driving circuit. The circuit is particularly advantageous for transmitting data at high frequencies and as such may have improved transmission characteristics by including on-chip series resistive elements as discussed in further detail below.

The integrated circuitry 102 includes the aforementioned first digital circuit 104 for transmission of the DATA signal (and for receipt of the DATA signal, in the case wherein the first transmission line is a bi-directional transmission line). The first digital circuit 104 may include an output driver for driving the data signal DATA onto the first transmission line and may include an input receiver circuit in the case wherein the first transmission line is bi-directional. The first transmission line also includes a first bonding pad 108 that is electrically connected to the first integrated circuit terminal 110. The first integrated circuit 102 may include a silicon die providing a plurality of bonding pads and a corresponding plurality of leads. The first pad 108, according to an embodiment of the present invention, may be such a bonding pad, and a wire (such as a gold wire) may be bonded thereto by known wire bonding processes to electrically connect the silicon die of the integrated circuit to first integrated circuit terminal 110 via bonding wire 107. According to the present invention, the first transmission line of the integrated circuitry 102 also includes a first integrated-circuit resistive element 106 connected in series between the first pad 108 and the first digital circuit 104.

The second transmission line includes the aforementioned second digital circuit 116 for transmission of the STROBE clocking signal and for receipt of the STROBE clocking signal, in the case wherein the second transmission line is a bi-directional transmission line. The second digital circuit 116 may include an output driver for driving the STROBE clocking signal onto the second transmission line and may include an input receiver circuit in the case wherein the second transmission line is bi-directional. The second transmission line includes a second bonding pad 120 that is electrically connected to the second integrated circuit terminal 122. The second pad 120 may also form part of the same lead frame described relative to the first bonding pad 108 and may be electrically coupled to the second integrated circuit terminal 122, another lead of the aforementioned lead frame. According to the present invention, the second transmission line of the integrated circuitry 102 also includes a second integrated-circuit conductive path 121 including a second integrated-circuit resistive element 118. The second integrated-circuit resistive element 118 may be connected in series between the second pad 120 and the second digital circuit 116, as shown in FIG. 1.

Figure 2A:
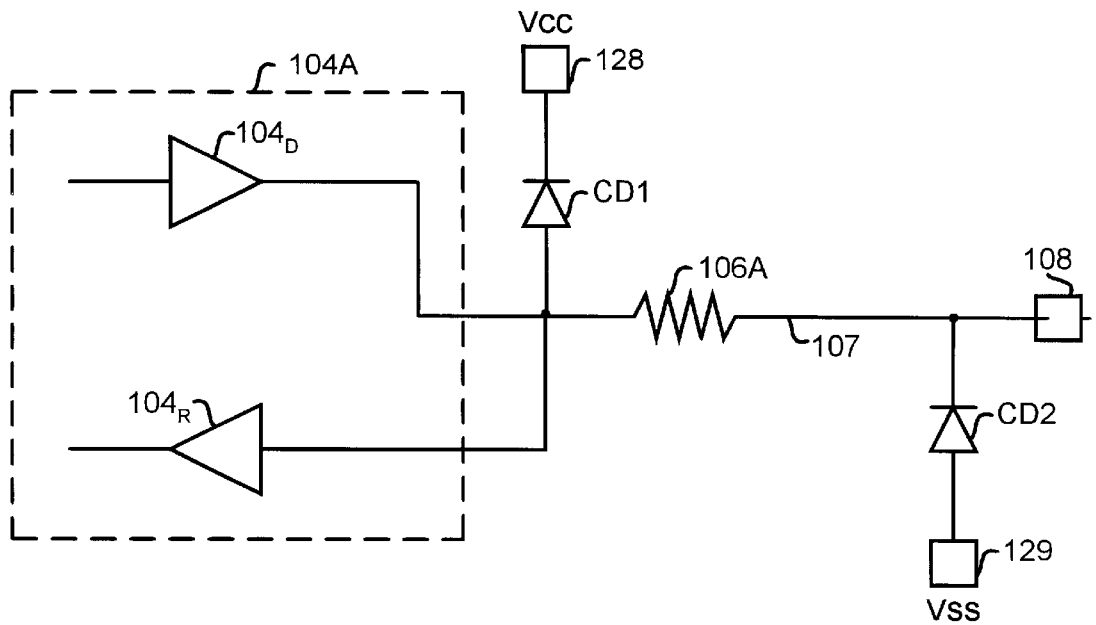
FIG. 2A is a circuit diagram showing an embodiment of a portion of the first transmission line of FIG. I between the first digital circuit 104 and the first pad 108, to illustrate a bi-directional nature thereof.

As alluded to above, the first and second transmission lines may be bi-directional transmission lines. FIG. 2A is a circuit diagram showing a configuration of a portion of the first transmission line of FIG. 1 (between the first digital circuit 104A and the first pad 108), to illustrate the bi-directional nature thereof. It is understood, however, that the structure shown in FIG. 2A is but one implementation of such a bi-directional transmission line, other implementations being possible, as those of skill in this art will readily recognize. As shown in FIG. 2A, the first digital circuit 104 may include an output driver 104D and an input receiver 104$_R$. The output of the output driver 104$_D$ is coupled to one terminal of the first integrated-circuit resistive element 106A via the first integrated circuit resistive path 107. The other terminal of the first integrated-circuit resistive element 106A may be electrically coupled (via wire-bonding, for example) to the first pad 108. Control circuitry (not shown) may also be coupled to the output driver 104D and to the input driver 104$_R$ of the first digital circuit 104A to ensure that only one of the output driver 104$_D$ and the input driver 104$_R$ is active at any given time.

As shown in FIG. 2A, the voltage of the first transmission line may be maintained between a first voltage level $V_{cc}$ and a second voltage level $V_{ss}$ by first and second voltage sources 128, 129, respectively. The voltage potential of the first transmission line may be prevented from climbing higher than the first voltage level $V_{cc}$ by a clamping circuit, such as clamping diode CD1 coupled between the first voltage source 128 and the first integrated circuit path 107. Likewise, the voltage potential of the first transmission line may be prevented from dropping lower than the second voltage level $V_{ss}$ by a clamping circuit, such as clamping diode CD2 coupled between the second voltage source 129 and the first integrated circuit path 107. For example, the first voltage source 128 may be set to 5 volts D.C. and the second voltage source 129 may be set at ground potential.

Figure 2B:
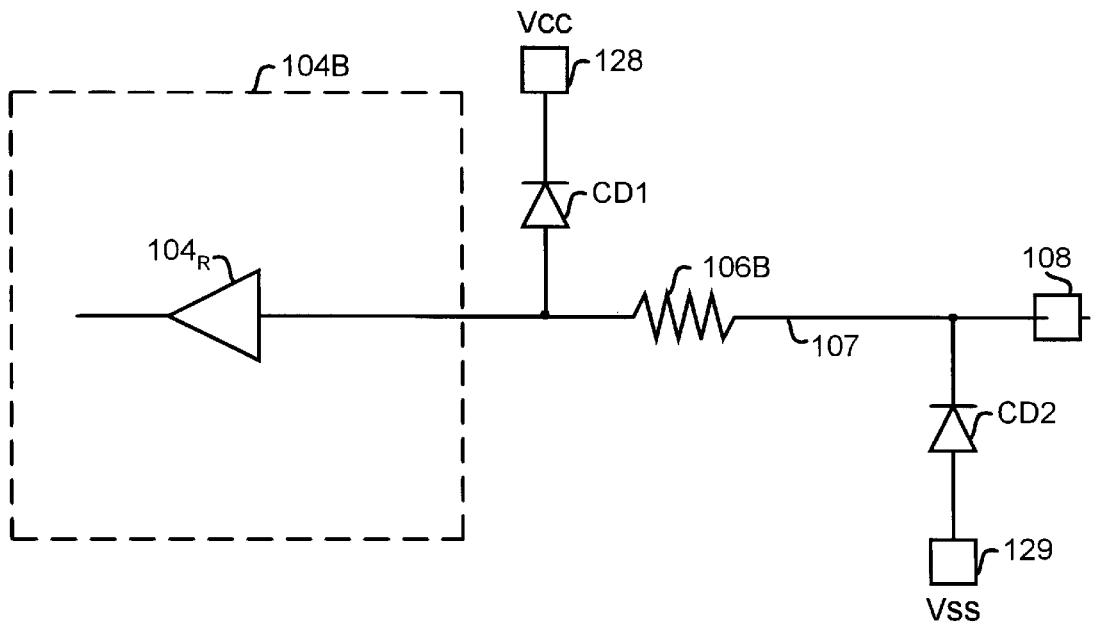
FIG. 2B is an embodiment of a transmission line adapted for receiving and terminating a strobe signal for sampling a data signal received by the circuit of FIG. 2A.

Preferably, a strobe signal for sampling data received in the bi-directional circuit of FIG. 2A is received by the receiver circuit 104B of FIG. 2B. By providing a separate circuit 104B for receiving a strobe, rather than the bi-directional circuit 104A of FIG. 2A, terminating resistance 106B can be separately optimized. For example, the ATA specification recommends a different termination (e.g. 82 ohms) at the receiving end than the driving end (22 ohms) of a strobe path.

The first and second integrated-circuit resistive elements 106 and 118, according to the present invention, implement the terminating function of terminating resistor specified in, for example, the UDMA protocol. Specifically, the first and second integrated-circuit resistive elements 106, 118 replace the corresponding conventional surface mounted resistors used to terminate data and control lines of host-peripheral interfaces. As the first and second integrated-circuit resistive elements 106,118 may be formed along with the other structures on the silicon die using integrated circuit forming processes, the manufacturing steps previously needed to mount the surface-mounted resistors on the printed circuit board assembly, such as shown at 100 in FIG. 1, are no longer needed. Eliminating these steps reduces the material costs of manufacturing the printed circuit board assembly 100 and eliminates the labor time and costs associated with mounting the termination resistors. Moreover, the presence of the first and second integrated-circuit resistive elements 106,118 within the integrated circuitry 102 effectively eliminates the need to identify and replace defectively mounted surface-mount resistors, as well as the need to allocate and expend funds for such activities.

According to an embodiment of the present invention, the first integrated-circuit element 106 has a first ohmic value, and the second integrated-circuit element 118 has a second ohmic value. Likewise, the first printed circuit conductive path 112 has a third ohmic value and the second printed circuit conductive path 124 has a fourth ohmic value. The ohmic magnitudes of the first integrated-circuit element 106, the second integrated-circuit element 118, the first printed circuit conductive path 112 and of the second printed circuit conductive path 124 may, according to an embodiment of the present invention, be interrelated in the following manner. The ratio of the third ohmic value to the first ohmic value may be such that the first ohmic value is in excess of an order of magnitude greater than the third ohmic value. The ratio of the fourth ohmic value to the second ohmic value may be such that the second ohmic value is in excess of an order of magnitude greater than the fourth ohmic value. The ratio of the first ohmic value to the second ohmic value may be substantially less than the ratio of the third ohmic value to the first ohmic value. The third and fourth ohmic values may be about equal to the ohmic value of a typical copper trace on a printed circuit board. In the case wherein the first and second integrated-circuit resistive elements 106, 118 implement a series termination for a UDMA interface, the third and fourth ohmic values may be about 0.002 Ω, while the first and second ohmic values may be about 30 Ω to about 90 Ω. Other interface protocols may specify terminating resistive elements having ohmic values differing from those listed above, and the present invention is readily adaptable to such other interface protocols.

The ATA specification for UDMA modes 3 and 4, for example, specifies that the effective driving impedance of a signal source as seen from the 80-conductor cable should be between 40 and 50 Ω, for a series terminating resistor of 33 Ω. It has been found that, according to the present invention, such series-terminating resistor need not be exactly 33 Ω and that a substantial degree of variability in the ohmic magnitude of the terminating resistor is allowable, despite the ATA recommendation. Indeed, it has also been found that a substantial degree of variability in the magnitude of the series-terminating resistor does not impede the operation of the resultant host-peripheral interface. Investigations into the permissible ohmic magnitude range of the series terminating have led to the conclusion that series terminating resistors having an ohmic magnitude between about 30 Ωand about 90 Ωwill adequately terminate the data and control lines of a source synchronous UDMA host-peripheral interface. In practical terms, this means that the data rates specified in UDMA modes 3 and 4, for example, are generally achievable as long as the integrated circuit resistive elements 106, 118 each have an ohmic magnitude measuring between about 30 Ω and about 90 Ω. This result was unexpected, as it was assumed that the value of the series terminating resistor had to be closely matched to the 33 Ω value specified in the UDMA specification, in order for the high data rates of modes 3 and 4 to be achievable. Moreover, the belief that terminating resistors must be high precision resistors has discouraged interface designers from attempting to integrate the termination resistors within the integrated circuitry 102 of the interface, as the ohmic value of integrated circuit resistors traditionally has been difficult to control with precision.

Figure 3:
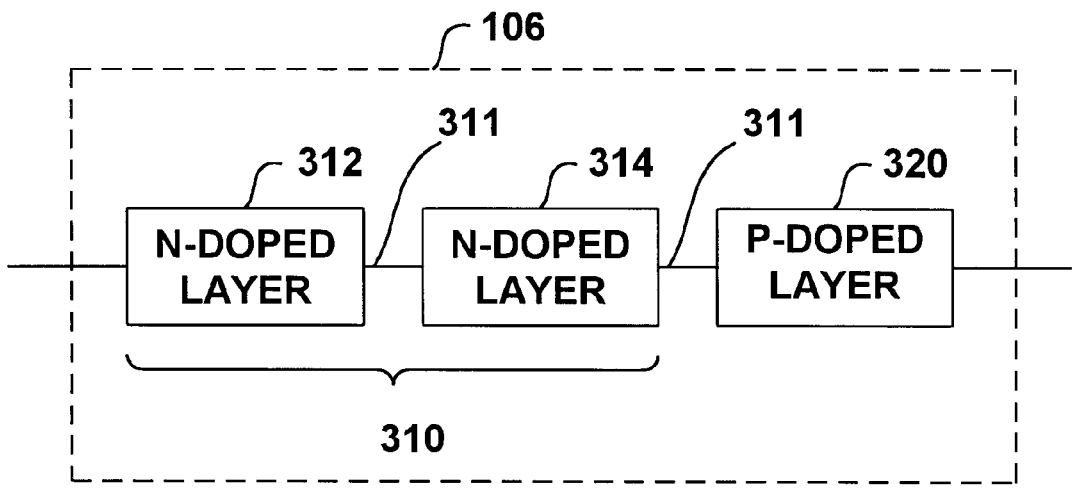
FIG. 3 is a representation of the structure of the first integrated circuit resistive element 106, according to an embodiment of the present invention.

As shown in the representation of FIG. 3, to control the ohmic value of the first integrated-circuit resistive element 106, according to an embodiment of the present invention, the first integrated-circuit resistive element 106 may comprise at least one first n-type portion 310 and at least one first p-type portion 320 separated from the first n-type portion 310. The first n-type portion 310 includes material doped with an n-type dopant and the first p-type portion 320 includes material doped with a p-type dopant. The first n-type portion 310, as shown in FIG. 3, may comprise a first n-type layer 312 including material doped with the n-type dopant and a second n-type layer 314 including material doped with the same or a different n-type dopant, the second n-type layer 314 being separated from the first n-type layer 312 and separated from the first p-type portion 320. The first p-type portion 320 may include a greater number of p-doped layers than is shown in FIG. 3, depending upon the requirements of the application at hand. The first n-type layer 312, the second n-type layer 314 and the first p-type portion 320 of the first integrated-circuit resistive element 106 may be electrically coupled to one another in series by a first metal layer (including aluminum, for example) shown in FIG. 3 at reference numeral 311. The first metal layer 311, in turn, may be electrically coupled to the first pad 108 shown in FIG. 1. Thus, the first n-type layer 312, the second n-type layer 314 and the first p-type portion 320 may constitute three discrete integrated-circuit resistive elements connected in series via the first metal layer 311.

Figure 4:
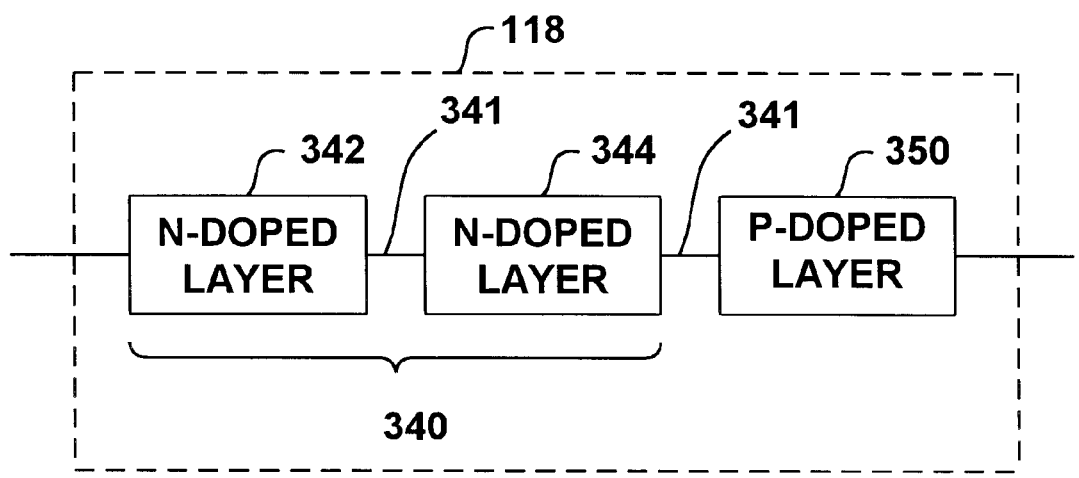
FIG. 4 is a representation the second integrated circuit resistive elements 118, according to an embodiment of the present invention.

The second integrated resistive element 118 may have the same or substantially the same structure as that of the first integrated-circuit resistive element 106. The structure of the second integrated-circuit resistive element 118, according to an embodiment of the present invention, is shown in the representation of FIG. 4. Indeed, as shown in FIG. 4, to control the ohmic value of the second integrated circuit resistive element 118, the second integrated-circuit resistive element 118 may comprise at least one second n-type portion 340 and at least one second p-type portion 350 separated from the second n-type portion 340. The second n-type portion 340 includes material doped with an n-type dopant and the second p-type portion 350 includes material doped with a p-type dopant. The second n-type portion 340, as shown in FIG. 4, may comprise a third n-type layer 342 including material doped with the n-type dopant and a fourth n-type layer 344 including material doped with the same or a different n-type dopant, the fourth n-type layer 344 being separated from the third n-type layer 342 and separated from the second p-type portion 350. Similarly, the second p-type portion 350 may include a greater number of p-doped layers than is shown in FIG. 4, depending upon the requirements of the application at hand. The third n-type layer 342, the fourth n-type layer 344 and the second p-type portion 350 of the second integrated-circuit resistive element 118 may be electrically coupled to one another in series by a second metal layer (including aluminum, for example) shown in FIG. 4 at reference numeral 341. The second metal layer 341, in turn, may be electrically coupled to the second pad 120 shown in FIG. 1. Thus, the third n-type layer 342, the fourth n-type layer 344 and the second p-type portion 350 may constitute three discrete integrated-circuit resistive elements connected in series via the second metal layer 341.

By forming each of the integrated circuit resistive elements 106, 118 with at least one layer including an n-type dopant (phosphorous, for example) and at least one layer including a p-type dopant (such as boron, for example), semiconductor manufacturing process parameters that affect n-type materials in one manner will tend to affect p-type materials in another, opposite manner. Thus, by including both n and p-type materials in the first and second integrated circuit resistive elements 106, 118, the variation in the ohmic magnitude values of the first and second integrated circuit resistive elements 106, 118, will be minimized over such process parameters.

When used within a host-peripheral interface implementing a UDMA mode 3 or mode 4 specification, for example, the first integrated circuit resistive element 106 may have a first ohmic value targeted at about 50 $\Omega$, squarely within the permissible range, according to the integrated circuit resistive element 118, according to an embodiment of the present invention, also may be targeted at about 50 $\Omega$. To achieve these results, the first n-type layer 312 and the second n-type layer 314 each may have an ohmic value of about 15 $\Omega$, whereas the first p-type portion 320 may have an ohmic value of about 20 $\Omega$. Similarly, the third n-type layer 342 and the fourth n-type layer 344 each may have an ohmic value of about 15 $\Omega$, whereas the second p-type portion 350 may have an ohmic value of about 20 $\Omega$. By including both n- and p-type dopants in the layers 312, 314 and portion 320 (FIG. 3) and in the layers 342, 344 and portion 350 (FIG. 4), and by appropriately adjusting the layer-forming process parameters, the first and second integrated circuit resistive elements 106, 118 may be formed within the integrated circuitry 102 with the requisite degree of precision to effectively terminate the data and control lines of a host-peripheral interface. The first and second integrated-circuit resistive elements 106, 118 may be formed by known Complementary Metal Oxide Semiconductor (CMOS) processes such as, for example, SGS Thompson Inc.'s 0.35 micron fabrication process referred to as "HCMOS6", although the present invention may be readily implemented using other processes at other line widths.

Conventional integrated-circuit resistors that do not include both n- and p-type portions are believed to be unsuitable for uses (such as for terminating data and control lines in a host-peripheral interface) requiring a small variance in the resulting ohmic value thereof. Such conventional integrated-circuit resistors typically exhibit an unacceptably wide range of resistance values. Indeed, the maximum resistance value for conventional integrated-circuit resistors typically ranges from about 3.5 to about 5 times the minimum resistance on the low side to about 10 times the minimum resistance on the high side of the range. By forming the terminating integrated-circuit resistive elements 106, 118 with both n- and p-type portions according to the present invention, the range of the resulting resistance values may be significantly narrowed: when formed as shown in FIGS. 3 and 4, the respective maximum resistance values integrated-circuit resistive elements 106, 118 are believed to be only about 3 times their respective minimum resistance values.

It is understood that the resistance (ohmic) values described herein are illustrative in nature do not operate to limit the present invention in any manner. Indeed, although the present invention finds application within the context of a UDMA host-peripheral interface, the structures and principles illustrated and described herein are applicable to any other bus protocol that requires (or benefits from) termination with resistive elements to reduce ringing and/or signal transmission losses to and from a host and/or a peripheral device, particularly but not limited to source synchronous circuits. Indeed, by matching the target ohmic values of the integrated circuit resistive elements 106, 118 to the characteristic impedance of the conductive path to be terminated or to a predetermined value, the requisite termination resistors may be formed within the integrated circuitry 102. Suitably, the integrated termination resistors may be provided by forming the first resistive element 106 as an integrated element of a chip with at least one first n-type portion 310 doped with an n-type impurity or impurities and with at least one first p-type portion 320 doped with a p-type impurity or impurities and forming the second resistive element 118 with at least one second n-type portion 340 doped with an n-type impurity or impurities and with at least one second p-type portion 350 doped with a p-type impurity or impurities. In other embodiments, the resistive elements may be formed using other integrated circuit structures which provide comparable control of yielded resistance range such as field effect transistors (FET's) or other active structures. In this manner, surface mounted termination resistors may be eliminated, and the cost of the entire manufacturing process correspondingly reduced.

While the foregoing detailed description has described preferred embodiments of the present invention, it is to be understood that the above description is illustrative only and not limiting of the disclosed invention. For example, the number of n- and/or p-doped may differ from that disclosed herein. Still other modifications may occur to those of skill in this art. The present invention, therefore, is to be limited only by the claims as set forth below.

We claim:

1. A printed circuit board assembly that is plug compatible with a host-peripheral interface via which digital data are synchronously transmitted at a data rate via conductive paths that exhibit transmission-line characteristics at the data rate, the printed circuit board assembly comprising:

a first integrated-circuit terminal and a first connector terminal;

a first transmission line for transmission of a data signal;

a second integrated-circuit terminal and a second connector terminal;

a second transmission line for transmission of a clocking signal;

integrated circuitry including:
      a first pad and a second pad;
      a first digital circuit for propagating the data signal through the first pad;
      a second digital circuit for propagating the clocking signal through the second pad;

the first transmission line including:
      a first integrated-circuit conductive path including a first integrated-circuit resistive element connected in series between the first pad and the first digital circuit; and
      a first printed-circuit conductive path;

the second transmission line including:
      a second integrated-circuit conductive path including a second integrated-circuit resistive element; and
      a second printed-circuit conductive path;

the first integrated-circuit element having a first ohmic value;

the second integrated-circuit element having a second ohmic value;

the first printed circuit conductive path having a third ohmic value, the ratio of the third ohmic value to the first ohmic value being such that the first ohmic value is in excess of an order of magnitude greater than the third ohmic value;

the second printed circuit conductive path having a fourth ohmic value, the ratio of the fourth ohmic value to the second ohmic value being such that the second ohmic value is in excess of an order of magnitude greater than the fourth ohmic value;

the ratio of the first ohmic value to the second ohmic value being substantially less than the ratio of the third ohmic value to the first ohmic value.

2. The printed circuit board assembly of claim 1, wherein the first integrated resistive element comprises at least one first n-type portion and at least one first p-type portion, the first n-type portion including material doped with an n-type dopant and the first p-type portion including material doped with a p-type dopant, the first n-type portion and the first p-type portion being electrically coupled to one another via a first metal layer.

3. The printed circuit board assembly of claim 2, wherein the first n-type portion comprises a first n-type layer including material doped with the n-type dopant and a second n-type layer including material doped with the n-type dopant, the second n-type layer being electrically coupled to the first n-type layer by the first metal layer.

4. The printed circuit board assembly of claim 1, wherein the second integrated resistive element comprises at least one second n-type portion and at least one second p-type portion, the second n-type portion including material doped with an n-type dopant and the second p-type portion including material doped with a p-type dopant, the second n-type portion and the second p-type portion being electrically coupled to one another via a second metal layer.

5. The printed circuit board assembly of claim 4, wherein the second n-type portion comprises a third n-type layer including material doped with the n-type dopant and a fourth n-type layer including material doped with the n-type dopant, the fourth n-type layer being electrically coupled to the third n-type layer by the second metal layer.

6. The printed circuit board assembly of claim 1, wherein each of the first and second ohmic values is selected in a range between about 30 $\Omega$ and about 90 $\Omega$.

7. The printed circuit board assembly of claim 1, wherein the integrated circuitry implements an ATA Ultra DMA protocol and wherein each of the first and second integrated circuit resistive elements includes at least one portion doped with an n-type dopant and at least one other portion doped with a p-type dopant.

8. An integrated circuit for a host-peripheral interface via which digital data are synchronously transmitted at a data rate via conductive paths that exhibit transmission-line characteristics at the data rate, the integrated circuit comprising:

a first integrated-circuit terminal and a first connector terminal;

a first transmission line for transmission of a data signal;

a second integrated-circuit terminal and a second connector terminal;

a second transmission line for transmission of a clocking signal;

a first pad and a second pad;

a first digital circuit for propagating the data signal through the first pad;

a second digital circuit for propagating the clocking signal through the second pad;

the first transmission line including a first integrated-circuit conductive path including a first integrated-circuit resistive element connected in series between the first pad and the first digital circuit, the first integrated resistive element comprising at least one first n-type portion and at least one first p-type portion, the first n-type portion including material doped with an n-type dopant and the first p-type portion including material doped with a p-type dopant, the first n-type portion and the first p-type portion being electrically coupled to one another via a first metal layer, the first n-type portion comprising a first n-type layer including material doped with the n-type dopant and a second n-type layer including material doped with the n-type dopant, the second n-type layer being electrically coupled to the first n-type layer by the first metal layer;

the second transmission line including a second integrated-circuit conductive path including a second integrated-circuit resistive element;

the first integrated-circuit element having a first ohmic value and the second integrated-circuit element having a second ohmic value, each of the first and second ohmic values being of a magnitude that substantially matches a characteristic impedance of the conductive paths at the data rate.

9. The integrated circuit of claim 8, wherein the magnitude of each of the first and second integrated circuit resistive elements is selected between about half and about double the characteristic impedance of the conductive paths at the data rate.

10. The integrated circuit of claim 8 wherein the first and second integrated circuit resistive elements are formed from an active structure.

11. The integrated circuit of claim 10 wherein the active structure is a FET.

12. The integrated circuit of claim 8, wherein the second integrated resistive element comprises at least one second n-type portion and at least one second p-type portion, the second n-type portion including material doped with an n-type dopant and the second p-type portion including material doped with a p-type dopant, the second n-type portion and the second p-type portion being electrically coupled to one another via a second metal layer.

13. The integrated circuit of claim 12, wherein the second n-type portion comprises a third n-type layer including material doped with the n-type dopant and a fourth n-type layer including material doped with the n-type dopant, the fourth n-type layer being electrically coupled to the third n-type layer by the second metal layer.

14. The integrated circuit of claim 8, wherein each of the first and second ohmic values is selected in a range between about 30 Ω and about 90 Ω.

15. The integrated circuit of claim 8, wherein the integrated circuit implements an ATA Ultra DMA protocol and wherein each of the first and second integrated circuit resistive elements includes at least one portion doped with an n-type dopant and at least one other portion doped with a p-type dopant.

16. A printed circuit board assembly comprising:

an integrated-circuit terminal and a connector terminal;

a printed-circuit conductive path connecting the integrated circuit terminal and the connector terminal;

integrated circuitry including:
 a pad;
 a digital circuit for propagating the signal through the pad;
 an integrated-circuit conductive path connecting the pad to the integrated circuit terminal, the integrated circuit conductive path including an integrated-circuit resistive element connected in series between the pad and the digital circlet, the integrated-circuit resistive element including at least one first portion doped with an n-type dopant electrically coupled to and separated from at least one second portion doped with a p-type dopant, the first portion doped with the n-type dopant comprising a first n-type layer including material doped with the n-type dopant and a second n-type layer including material doped with the n-type dopant, the second n-type layer being electrically coupled with first n-type layer via a metal layer.

17. An integrated circuit for a host-peripheral interface via which digital data are synchronously transmitted at a data rate via Conductive paths that exhibit transmission-line characteristics at the data rate, the integrated circuit comprising:

a first integrated-circuit terminal and a first connector terminal;

a first transmission line for transmission of a data signal;

a second integrated-circuit terminal and a second connector terminal;

a second transmission line for transmission of a clocking signal;

a first pad and a second pad;

a first digital circuit for propagating the data signal through the first pad;

a second digital circuit for propagating the clocking signal through the second pad;

the first transmission line including a first integrated-circuit conductive path including a first integrated-circuit resistive element connected in series between the first pad and the first digital circuit;

the second transmission line including a second integrated-circuit conductive path including a second integrated-cicuit resistive element, the second integrated resistive element comprising at least one second n-type portion and at least one second p-type portion, the second n-type portion including material doped with an n-type dopant and the second p-type portion including material doped with a p-type dopant, the second n-type portion and the second p-type portion being electrically coupled to one another via a second metal layer, the second n-type portion comprising a third n-type layer including material doped with the n-type dopant and a fourth n-type layer including material doped with the n-type dopant, the fourth n-type layer being electrically coupled to the third n-type layer by the second metal layer;

the first integrated-circuit element having a first ohmic value and the second integrated-circuit element having a second ohmic value, each of the first and second ohmic values being of a magnitude that substantially matches a characteristic impedance of the conductive paths at the data rate.

18. The integrated circuit of claim, 17, wherein each of the first and second ohmic values is selected in a range between about 30 Ω and about 90 Ω.

19. he integrated circuit of claim 17, wherein the integrated circuit implements an ATA Ultra DMA protocol and wherein each of the first and second integrated circuit resistive elements includes at least one portion doped with an n-type dopant and at least one other portion doped with a p-type dopant.

20. The integrated circuit of claim 17, wherein the first and second integrated circuit resistive elements are formed from an active structure.

21. The integrated circuit of claim 20 wherein the active structure is a FET.

22. The integrated circuit of claim 17, wherein the magnitude of each of the first and second integrated circuit resistive elements is selected between about half and about double the characteristic impedance of the conductive pats at the data rate.

23. The integrated circuit of claim 17, wherein the first integrated resistive element comprises at least one first n-type portion and at least one first p-type portion, the first n-type portion including material doped with an n-type dopant and the fist p-type portion including material doped with a p-type dopant, the first n-type portion and the first p-type portion being electrically coupled to one another via a first metal layer.

24. The integrated circuit of claim 23, wherein the first n-type portion comprises a first n-type layer including material doped with the n-type dopant and a second n-type layer including material doped with the n-type dopant, the second n-type layer being electrically coupled to the first n-type layer by the first metal layer.

* * * * *